US012581867B2

(12) United States Patent　　　　(10) Patent No.:　US 12,581,867 B2
Trodahl et al.　　　　　　　　　　　(45) Date of Patent:　Mar. 17, 2026

(54) SWITCHABLE MAGNETIC DEVICE OR DOT FOR DATA STORAGE

(71) Applicants: Harry Joseph Trodahl, Wellington (NZ); William Freeman Holmes-Hewett, Wellington (NZ); Jackson David Miller, Wellington (NZ); Catherine Margaret Walker Pot, Wellington (NZ); Benjamin John Ruck, Lower Hutt (NZ); Eva-Maria Johanna Anton, Lincoln (NZ)

(72) Inventors: Harry Joseph Trodahl, Wellington (NZ); William Freeman Holmes-Hewett, Wellington (NZ); Jackson David Miller, Wellington (NZ); Catherine Margaret Walker Pot, Wellington (NZ); Benjamin John Ruck, Lower Hutt (NZ); Eva-Maria Johanna Anton, Lincoln (NZ)

(73) Assignee: VICTORIA LINK LIMITED TRADING AS WELLINGTON UNIVENTURES, Wellington (NZ)

( * ) Notice: Subject to any disclaimer, the term of this patent is extended or adjusted under 35 U.S.C. 154(b) by 532 days.

(21) Appl. No.: 17/974,148

(22) Filed: Oct. 26, 2022

(65) Prior Publication Data

US 2024/0147869 A1　　May 2, 2024

(51) Int. Cl.
　　*H10N 50/80*　　　(2023.01)
　　*H10B 61/00*　　　(2023.01)
　　*H10N 50/85*　　　(2023.01)
(52) U.S. Cl.
　　CPC ............. *H10N 50/80* (2023.02); *H10B 61/00* (2023.02); *H10N 50/85* (2023.02)

(58) Field of Classification Search
　　CPC .... H10K 50/84; H10K 59/873; H10K 50/844; H10K 59/131; H10H 20/852; H10H 20/0362
　　See application file for complete search history.

(56) References Cited

U.S. PATENT DOCUMENTS

2017/0018346 A1 *　1/2017　Natali .................... H10N 50/01

* cited by examiner

*Primary Examiner* — Wasiul Haider
(74) *Attorney, Agent, or Firm* — Nixon & Vanderhye, PC

(57) ABSTRACT

A switchable magnetic device comprising a first ferromagnetic material or layer comprising or consisting of a first rare earth nitride alloy, the first rare earth nitride alloy including at least two lanthanide species; a second ferromagnetic material or layer comprising or consisting of a second rare earth nitride alloy, the second rare earth nitride alloy including at least two lanthanide species; a blocking material or layer located between the first and second ferromagnetic materials or layers. The first and second ferromagnetic materials or layers have different coercive fields to permit independent control of a magnetic alignment of the first and second ferromagnetic materials or layers; and a remanent magnetic moment of the first ferromagnetic material or layer and a remanent magnetic moment of the second ferromagnetic material or layer spatially restrict or confine a peripheral magnetic field generated when the first and second ferromagnetic materials or layers are in an anti-aligned magnetic state to permit contrasting peripheral magnetic fields to be generated when the first and second ferromagnetic materials or layers are in anti-aligned and aligned magnetic states.

20 Claims, 6 Drawing Sheets

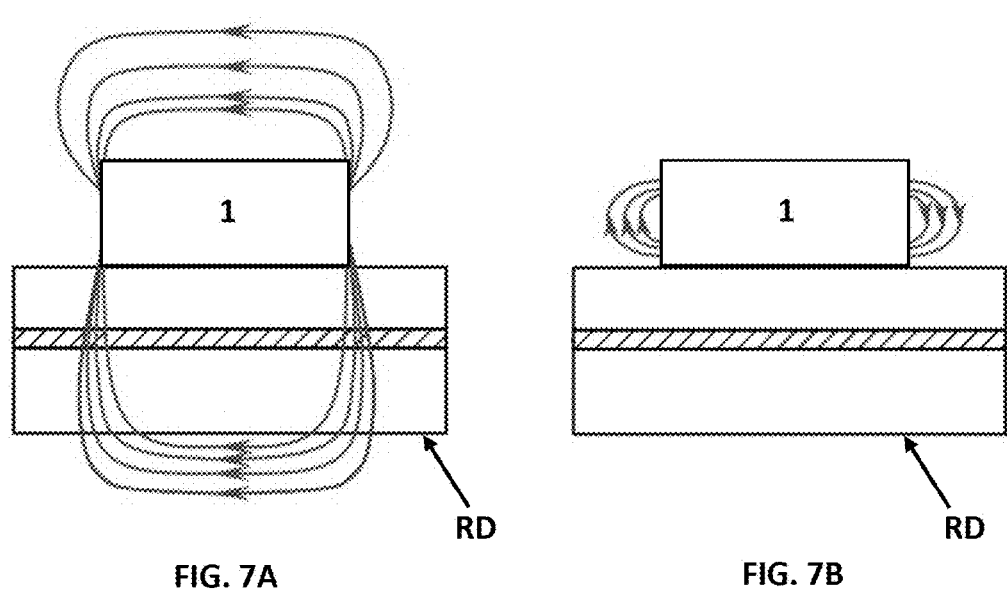
FIG. 7A
FIG. 7B
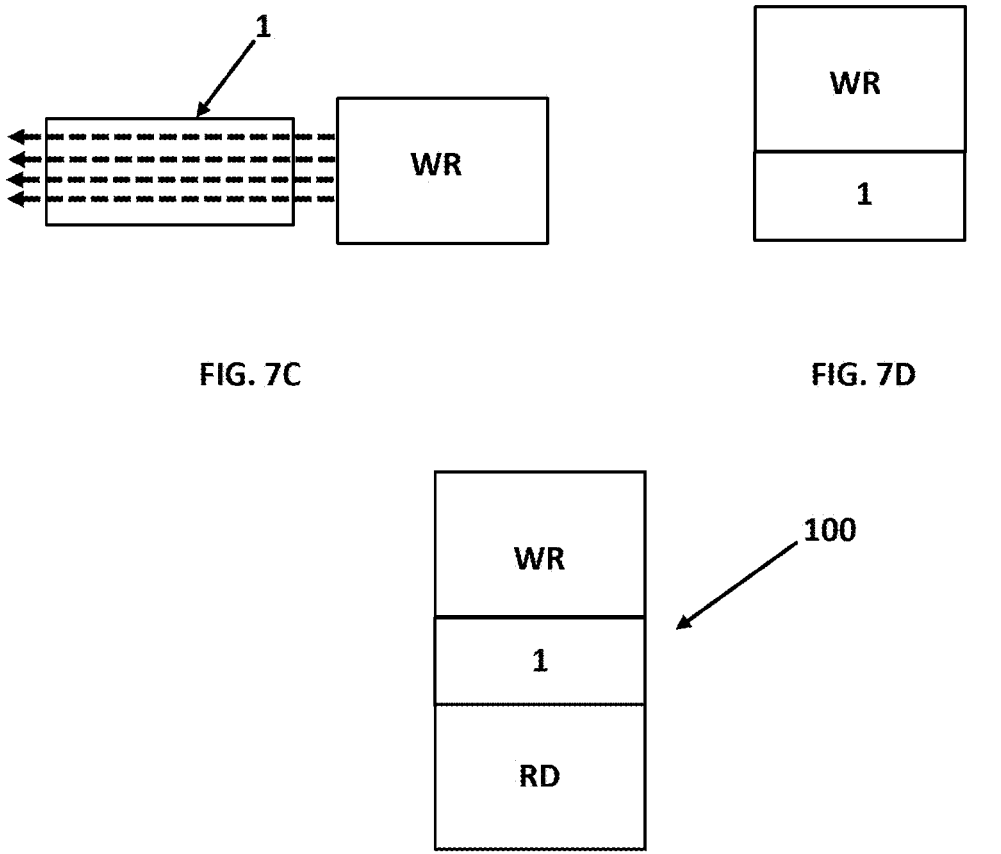
FIG. 7C
FIG. 7D
FIG. 7E

SWITCHABLE MAGNETIC DEVICE OR DOT FOR DATA STORAGE

FIELD OF THE INVENTION

The present invention is directed to the field of magnetic devices for data storage, such as magnetic devices whose generated magnetic field may be switched between different states representing storage or digital states, and more particularly directed to rare earth nitride switchable magnetic devices.

BACKGROUND

Magnetic memory technology is widely implemented based on magneto-resistive RAM (MRAM) or spin transfer torque MRAM.

Magneto-resistive RAM (MRAM) operates by an applied magnetic field placing the magnetization direction of first and second ferromagnetic magnetic layers in parallel/aligned states or in non-parallel/non-aligned states which produce contrasting magnetoresistances associated with a digital data representation of '0' and '1'. However, magneto-resistive RAM is known to suffer from scaling problems due to the increased current required for generating the switching magnetic field which increases as a wire cross-section decreases.

A spin transfer torque MRAM does not require an external magnetic field. Switching occurs due to the spin transfer torque produced by a spin-polarized current. However, as the spin-polarized current is only a fraction of the total charge current flowing through the device, relatively high current densities are required to switch the magnetization direction.

U.S. Ser. No. 10/373,752 discloses a magnetic material comprising a SmN ferromagnetic layer, a GdN ferromagnetic layer and a non-magnetic LaN blocking layer between and in contact with the SmN and GdN ferromagnetic layers. A magnetic material comprising first and second GdN ferromagnetic layers with a thin GaN blocking layer between and in contact with the GdN ferromagnetic layers is also disclosed. A GdN/GaN/GdN tunnel junction device having a ferromagnetic gadolinium metal acting as a capping layer was formed. The measured magnetoresistance, measured in both increasing and decreasing magnetic fields applied parallel to the layers, has a hysteresis characteristic of magnetic tunnel junctions where one ferromagnetic layer switches at a lower field than the other. The hysteresis in the magnetoresistance is attributed to differences in the dominant magnetization directions in the GdN layers at low magnetic fields resulting in a high resistance state at low magnetic fields. U.S. Ser. No. 10/373,752 also discloses that when the blocking layer is a conductor, the magnetic material is suitable for use in giant magnetoresistance (GMR) magnetic field sensors, while magnetic materials comprising insulating blocking layers are suitable for use in MRAM devices and TMR magnetic field sensors.

Therefore, in light of the above discussed deficiencies of the presently available switchable magnetic storage devices, alternative technically advanced solutions are desired in the field of data storage, and in particular data storage at cryogenic temperatures. A most immediate need is in cryogenic magnetic data memory for supercomputers based on superconducting Josephson junction central processors as well as cryogenic magnetic data memory for significantly reduced energy demand by mass storage banks in cloud data centers.

SUMMARY

According to one aspect of the present invention, a switchable magnetic device is provided. The switchable magnetic device includes a first ferromagnetic material or layer comprising or consisting of a first rare earth nitride alloy, the first rare earth nitride alloy including at least two lanthanide species; a second ferromagnetic material or layer comprising or consisting of a second rare earth nitride alloy, the second rare earth nitride alloy including at least two lanthanide species; a non-magnetic exchange blocking material or layer located between the first and second ferromagnetic materials or layers. Moreover, the switchable magnetic device preferably includes first and second ferromagnetic materials or layers having different coercive fields to permit independent control of a magnetic alignment of the first and second ferromagnetic materials or layers; and a remanent magnetic moment of the first ferromagnetic material or layer and a remanent magnetic moment of the second ferromagnetic material or layer spatially restrict or confine a peripheral magnetic field generated when the first and second ferromagnetic materials or layers are in an anti-aligned magnetic state to permit contrasting peripheral magnetic fields to be generated when the first and second ferromagnetic materials or layers are in anti-aligned and aligned magnetic states.

According to another aspect of the present invention, a cryogenic digital data storage device including at least one or a plurality of switchable magnetic devices is provided. According to still another aspect of the present invention, a cryogenic digital data storage system is provided, the system including at least one or a plurality of storage elements; and at least one writer to set a storage state of the storage element, and at least one reader configured to detect or measure a magnetic fringe field of the storage element.

According to yet another aspect of the present invention, a method for setting a storage state of a switchable magnetic device is provided.

The above and other objects, features and advantages of the present invention and the manner of realizing them will become more apparent, and the invention itself will best be understood from a study of the following description with reference to the attached drawings showing some preferred embodiments of the invention.

BRIEF DESCRIPTION OF THE SEVERAL VIEWS OF THE DRAWINGS

The accompanying drawings, which are incorporated herein and constitute part of this specification, illustrate the presently preferred embodiments of the invention, and together with the general description given above and the detailed description given below, serve to explain features of the invention.

FIG. 4A schematically shows a schematic magnetization of the switchable magnetic device and four device states for the purpose of explaining the characteristics and operation of the switchable magnetic device of the present disclosure. FIG. 4B shows a generated magnetic fringe field in the four device states. FIG. 4C shows an exemplary operation cycle of the switchable magnetic device allowing switching a low magnetic fields.

FIGS. 7A to 7B schematically show a switchable magnetic device according to the present disclosure and a reading device for measuring or determining a state of the switchable magnetic device.

FIGS. 7C to 7D schematically show a switchable magnetic device according to the present disclosure and a writing device for setting a state of the switchable magnetic device.

FIG. 7E schematically shows a system including a switchable magnetic device according to the present disclosure, a reading device for measuring or determining a state of the switchable magnetic device and a writing device for setting a state of the switchable magnetic device.

Herein, identical reference numerals are used, where possible, to designate identical elements that are common to the figures. Also, the images are simplified for illustration purposes and may not be depicted to scale.

DETAILED DESCRIPTION OF THE SEVERAL EMBODIMENTS

Figure 1:
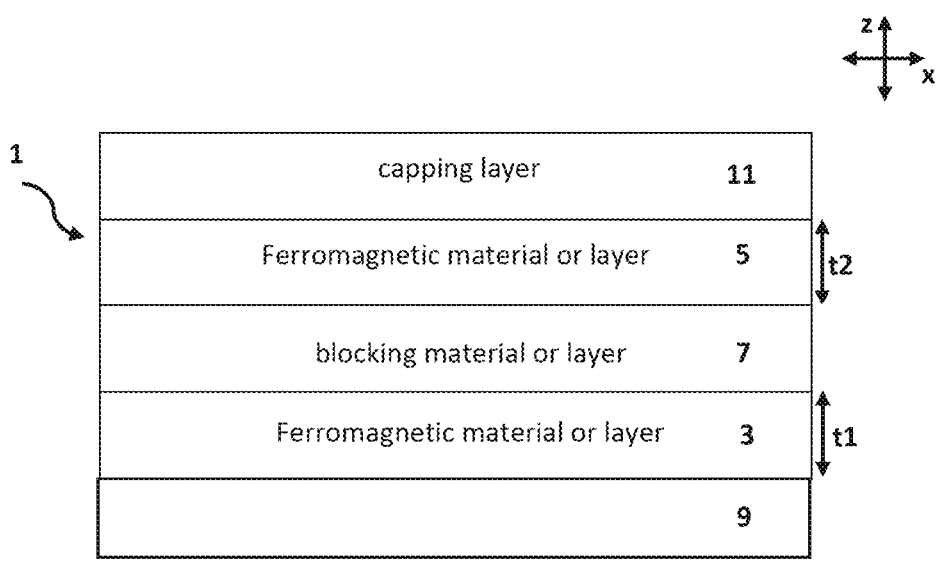
FIG. 1 is a schematic of an exemplary switchable magnetic device according to the present disclosure.

According to one aspect of the present invention, the switchable magnetic device 1 includes a first ferromagnetic material or layer 3 comprising or consisting solely of a first rare earth nitride alloy and a second ferromagnetic material or layer 5 comprising or consisting solely of a second rare earth nitride alloy. FIG. 1A schematically shows an exemplary embodiment of the device 1

The device 1 includes a blocking material or layer 7 located between the first and second ferromagnetic materials or layers 3,5. The blocking material or layer 7 is, for example, in direct contact with the first and second ferromagnetic materials or layers 3,5. The first and second ferromagnetic materials or layers 3,5 typically have a thickness of 2 nm or more, for example, a thickness between 2 nm and 200 nm.

The rare earth nitride alloy of each ferromagnetic material or layer 3, 5 is a solid solution of, for example, at least a first lanthanide nitride LN and at least a second lanthanide nitride L'N. The first lanthanide nitride LN and the second lanthanide nitride L'N are different, for example, can be samarium nitride SmN and gadolinium nitride GdN. The rare earth nitride alloy is not limited to an alloy or solid solution of only two lanthanide nitrides, additional lanthanide nitrides may also be included.

The first rare earth nitride alloy of the first ferromagnetic material or layer 3 includes at least two lanthanide elements or species L, L' to form the rare earth nitride alloy or solid solution (LL')N. The second rare earth nitride alloy of the first ferromagnetic material or layer 5 includes at least two lanthanide elements or species L, L' to form the rare earth nitride alloy or solid solution (LL')N. Two or more than two lanthanide nitrides may be used to form the alloys and solid solutions. The rare earth nitride alloy of the first ferromagnetic material or layer 3 may include the same lanthanide elements L, L' as that of the second ferromagnetic material or layer 5, with the fractional composition of the lanthanide elements L, L' being different. Alternatively, the rare earth nitride alloy of the first ferromagnetic material or layer 3 may include the different lanthanide elements L, L' to that of the second ferromagnetic material or layer 5 that includes the lanthanide elements L", L'". The lanthanide nitride material and the alloys and solid solutions form ferromagnetic materials.

The lanthanide elements comprise fifteen lanthanide elements: lanthanum La, cerium Ce, praseodymium Pr, neodymium Nd, promethium Pm, samarium Sm, europium Eu, gadolinium Gd, terbium Tb, dysprosium Dy, holmium Ho, erbium Er, thulium Tm, ytterbium Yb, lutetium Lu. The lanthanide element L, L', L", L'" may thus be or consist of lanthanum La, or cerium Ce, or praseodymium Pr, or neodymium Nd, or promethium Pm, or samarium Sm, or europium Eu, or gadolinium Gd, or terbium Tb, or dysprosium Dy, or holmium Ho, or erbium Er, or thulium Tm, or ytterbium Yb, or lutetium Lu. These lanthanide elements are rare-earth elements.

Figure 2A:
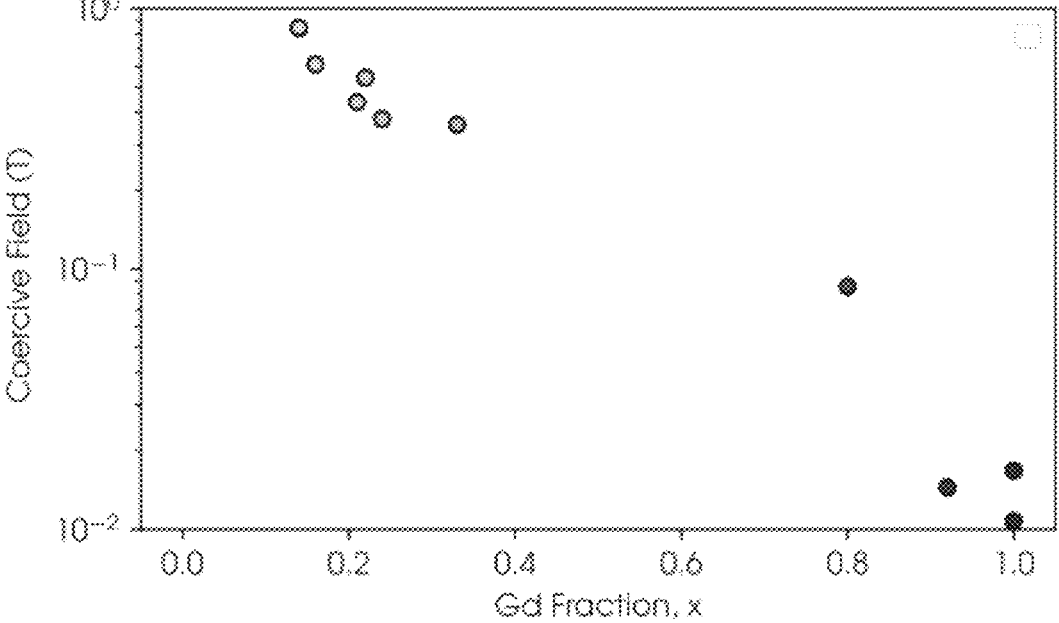
FIG. 2A shows measurements of a coercive field for various solid solutions of Gd, Sm, N; that is, the coercive field of $Gd_xSm_{1-x}N$ films as a function of x. The coercive fields span orders of magnitude allowing to fabricate materials or of $Gd_xSm_{1-x}N$ films with significantly contrasting coercive fields, which can thus be independently switched.
Figure 2B:
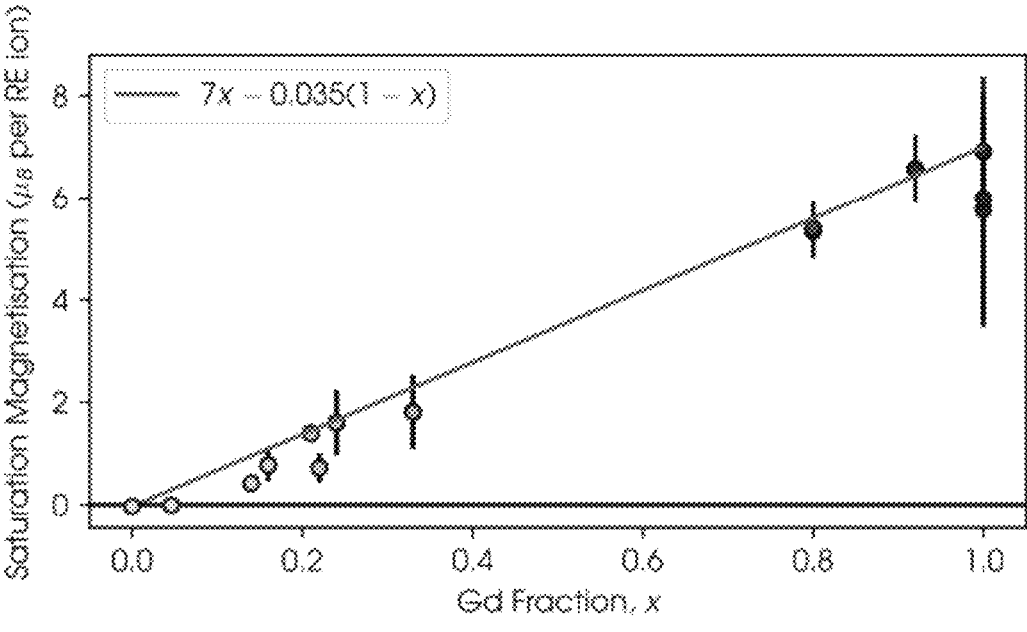
FIG. 2B shows measurements of the saturation magnetization for various solid solutions comprising Gd, Sm, N; that is, the saturation magnetization of $Gd_xSm_{1-x}N$ material as a function of x. The saturation magnetization per rare earth (RE) ion scales with the concentration of Gd.

The lanthanide nitride solid solutions are mixed cation materials with the cation site occupied by a controlled mixture of two or more lanthanides. This advantageously permits a continuous control of the magnetic properties that are central to functioning of the switching magnetic device 1 of the present disclosure. Binary solid solutions $(L_x, L'_{1-x})N$, $0 \le x \le 1$ may, for example, be formed or ternary alloys, $(L_x, L_y, L''_{1-x-y})N$, $(0 \le x \le 1)$, $(0 \le y \le 1-x)$ where L, L', L" indicate lanthanide elements and N nitrogen. One example of a binary solid solutions $(L_x, L'_{1-x})N$, $0 \le x \le 1$ is $(Gd_x Sm_{1-x})N$ for which FIGS. 2A and 2B show measured magnetic properties, more specifically, the coercive field and the saturation magnetization. As demonstrated in FIGS. 2A and 2B, these alloys and solid solutions permit the provision of ferromagnetic materials having different magnetic properties that are exploited in the switchable magnetic device 1, and which can be used in magnetic storage devices or cryogenic magnetic data memory.

The rare earth nitride alloy and solid solution of the ferromagnetic material or layer may be an alloy of any two or three or more of: lanthanum nitride LaN, cerium nitride CeN, praseodymium nitride (PrN), neodymium nitride (NdN), promethium nitride PmN, samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride LuN.

The blocking material or layer 7 is preferably a non-magnetic material or a non-magnetic exchange blocking material. The blocking layer 7 prevents magnetic exchange between the first and second ferromagnetic layers 3, 5. The blocking layer allows independent control of the magnetic alignment of the first and second ferromagnetic materials or layers 3, 5 by an external magnetic field, or by spin transfer torque. The blocking layer preferably has no permanent magnetic moment or has no ordering of the intrinsic electron spins. The blocking layer 7 has, for example, a thickness between 2 nm and 200 nm.

The non-magnetic material may, for example, comprise or consist solely or essentially of a non-magnetic metal such as aluminum, silver, gold, and titanium. The non-magnetic material may comprise or consist solely or essentially of a non-magnetic lanthanide nitride or rare earth nitride, for example, LuN or LaN which can provide the additional advantage of being lattice-matched to the other layers of the device 1.

The blocking layer 7 may, for example, be a non-magnetic insulator. The blocking layer 7 may, for example, comprise or consist solely or essentially of AlN, GaN, or (Al,In,Ga)N alloys. The blocking layer 7 may, for example, comprise a multi-layer structure of blocking materials.

The blocking layer 7 may, for example, be epitaxial with the first ferromagnetic layer 3, or the blocking layer 7 may, for example, be polycrystalline. The second ferromagnetic layer 5 may, for example, be epitaxial with the blocking layer 7 or may, for example, be polycrystalline. The blocking layer 7 may, for example, be epitaxial with the first ferromagnetic layer 3 and the second ferromagnetic layer 5 may, for example, be epitaxial with the blocking layer.

The switchable magnetic device 1 also includes at least one substrate 9 selected based on the target application or device upon which the first ferromagnetic material or layer 3 is deposited as well as the subsequently materials and layers of the device 1. The substrate 9 may, for example, comprise or consist of sapphire (Al₂O₃), lanthanum aluminate (LaAlO₃ or LAO) or silicon Si (for example, a silicon substrate with an AlN deposition layer provided thereon, for instance, a (111) silicon substrate with a deposition layer that is a hexagonal (0001)-oriented AlN deposition layer (for example, 100 nm thick) provided on the silicon substrate).

The switchable magnetic device 1 may alternatively be formed on a device or device structure that forms or defines the substrate 9 upon which the ferromagnetic layers 3, 5, the blocking layer 7 and a capping layer 11 are provided or deposited. The material films or layers are deposited on top of the other device or device structure. The other device or device structure may, for example, be a writer WR, or a reader RD for measuring a state of the magnetic layers of the switchable magnetic device 1, for example, a Josephson junction.

The switchable magnetic device 1 also includes at least one capping material or layer 11 provided on the second ferromagnetic layer 5, for example, directly on the second ferromagnetic layer 5. The capping material or layer 11 protects the ferromagnetic layer 5 to avoid a reaction with the ambient atmosphere that may decompose or oxidize the material or layer 5. The capping layer 11 is for passivating the ferromagnetic material 5, for example, for protection against oxidation. The capping layer or material 11 can for example include or consist solely of Al, W, Cr, Cu, Gd, Mg, TaN, NbN, Si, YSZ, GaN, GaAs, AlN, (Al,In,Ga)N alloys, or MgF₂. The capping material or layer thickness is preferably between 1 nm to 200 nm, for example, between 20 nm to 50 nm.

The capping layer 11, the first rare earth nitride alloy and the first ferromagnetic material or layer 3, the non-magnetic exchange blocking material or layer 7 and the second rare earth nitride alloy and second ferromagnetic material or layer 5 (and optionally the substrate 9) define or form, for example, a superposed multi-layer structure.

The first and second ferromagnetic materials or layers 3, 5 have different coercive fields. This permits to independently control a direction of magnetic alignment of the first and second ferromagnetic materials or layers 3, 5. The magnetic alignment of one ferromagnetic material or layer can be changed from an aligned orientation or direction with respect to the other ferromagnetic material or layer, to a non-aligned orientation or direction. The higher coercive field of the other ferromagnetic material or layer assures that the non-aligned orientation or direction between the first and second ferromagnetic material or layer.

Similarly, the magnetic alignment of one ferromagnetic material or layer can be changed from a non-aligned state to an aligned state with respect to the other ferromagnetic material or layer. The ferromagnetic material or layer having a lower coercive fields can be controlled to independently control of a direction of its magnetic moment. This permits the rare earth nitride alloy of lower coercive field to change magnetic alignment without a change in magnetic alignment of the rare earth nitride alloy of higher coercive field and place the ferromagnetic materials or layers in opposing magnetic alignment states.

The coercive field of one of the ferromagnetic materials or layers 3,5 is higher than the coercive field of the other ferromagnetic layer. This, together with the blocking layer 7, permits the magnetic alignment of the ferromagnetic layer with the lower coercive field to be altered by an external field or by spin transfer torque without altering the magnetic alignment of the ferromagnetic layer with the higher coercive field.

The coercive field of the first ferromagnetic layer 3 is, for example, higher than that of the second ferromagnetic layer 5.

The coercive field of the ferromagnetic layer with the higher coercive field is, for example, larger than the coercive field of the layer with the lower coercive field by a factor of at least 2, or at least 10, or at least 75. The coercive field of the ferromagnetic layer with the lower coercive field is, for example, less than 500 Oe, or less than 200 Oe. The coercive fields are measured, for example, at 70 K, 50 K or 4 K.

FIG. 2A shows the measured coercive field for the alloy (Gd$_x$Sm$_{1-x}$)N as a function or amount of Gd in the (Gd$_x$ Sm$_{1-x}$)N alloy. The measurements were performed at a temperature of 5 K. As seen in FIG. 2A, the coercive field of the alloy has a different value that is dependent on the fraction of the lanthanide elements in the alloy. For the exemplary alloy of FIG. 2A, an alloy of high Gd fractional content, for example 0.8 (Sm fractional content of 0.2), has a much lower coercive field than an alloy of lower Gd fractional content, for example 0.2 (Sm fractional content of 0.8). This higher coercive field of the lower Gd fractional content of the (Gd$_x$Sm$_{1-x}$)N alloy allows independent control of a direction of magnetic alignment of the alloy of higher Gd fractional content.

The fractional content of the lanthanide elements of the lanthanide nitride alloy also simultaneously permits to set the magnetic moment of rare earth nitride alloy and the ferromagnetic layer 3, 5. FIG. 2B shows the measured saturation magnetization for the alloy $(Gd_xSm_{1-x})N$ as a function or amount of Gd in the $(Gd_xSm_{1-x})N$ alloy. The measurements were obtained at a temperature of 5 K. As seen by FIG. 2B, the saturation magnetization of the alloy is dependent on the fraction of the lanthanide elements in the alloy. For the exemplary alloy of FIG. 2B, an alloy of high Gd fractional content, for example 0.9 (Sm fractional content of 0.1), has a much higher saturation magnetization than an alloy of lower Gd fractional content, for example 0.25 (Sm fractional content of 0.75).

The saturation magnetization of the alloy is thus dependent on the fraction of the lanthanide elements in the alloy and allows to control and set the magnetic moment or remanent magnetic moment of the alloy and the ferromagnetic layer 3, 5. The remanent magnetic moment of the alloy is set or determined by the fractional composition of the lanthanide species or elements and the volume of the ferromagnetic material or layer 3, 5. For a given fractional composition of the lanthanide species or elements, and a given width (y-direction) and length (x-direction) of the ferromagnetic material or layer 3, 5, a deposited thickness t1, t2 (z-direction) of the ferromagnetic material or layer 3, 5 permits to set a desired remanent magnetic moment of the alloy and the ferromagnetic layer 3, 5. A width (y-direction) and length (x-direction) of the substrate 9 may, for example, set the width (y-direction) and length (x-direction) of the ferromagnetic material or layer 3, 5 thus allowing precise control of the remanent magnetic moment of the alloy and the ferromagnetic layer 3, 5.

The remanent magnetic moment of the first ferromagnetic material or layer 3 and/or the first rare earth nitride alloy is thus determined by the fractional composition of the lanthanide elements or species and the volume of the first ferromagnetic material or layer 3, and the remanent magnetic moment of the second ferromagnetic material or layer 5 and/or the second rare earth nitride alloy is determined by the fractional composition of the lanthanide species or elements and the volume of the second ferromagnetic material or layer 5.

The remanent magnetic moment generates a remaining magnetic field strength or magnetic fringe field (schematically shown in FIG. 4B) whose amplitude depends on the magnetic alignment of the ferromagnetic materials or layers of the device 1.

The simultaneous control of coercive field and the remanent magnetic moment for each ferromagnetic material or layer 3,5 allows a magnetic device that can be switched on and off, that is, a magnetic device whose magnetic field or magnetic field strength can be switched on or off, or whose magnetic field strength is sufficiently contrasting in on and off states of the magnetic device that these contrasting on and off states permits to define storage states of a storage device.

The magnetic device 1 of the present disclosure assures such a behavior through independent switching of the magnetic alignment of one of the ferromagnetic material or layer 3 so that the ferromagnetic materials or layers are in magnetically non-aligned orientations, and when in such a state, the remanent magnetic moment of the ferromagnetic materials or layers 3,5 is such that the magnetic field strength generated by the device 1 in this non-aligned configuration is reduced and sufficiently contrasting compared to the magnetic field strength generated by the device 1 when the ferromagnetic materials or layers are in magnetically aligned orientations. That is, the resulting net remanent magnetic moment generates a magnetic field strength in the non-aligned configuration that is reduced and sufficiently contrasting compared to the magnetic field strength generated by the resulting net remanent magnetic moment when the ferromagnetic materials or layers are in magnetically aligned orientations.

The anti-aligned or non-aligned orientation of the magnetic alignment is, for example, an anti-alignment or non-alignment at zero degrees, or, for example, to within 20 degrees.

The remanent magnetic moment of first and second ferromagnetic materials or layers 3, 5 or the first and second rare earth nitride alloys in magnetically aligned orientations or states thereof generates a peripheral magnetic field extending a distance outside the switchable magnetic device 1 and permits detection of a first storage state of the switchable magnetic device 1. This remanent magnetic moment of the first and second ferromagnetic materials or layers 3, 5 or the first and second rare earth nitride alloys in magnetically non-aligned states or orientations thereof generates a spatially restricted or confined peripheral magnetic field and/or a reduced/contrasting magnetic field strength permitting detection of a second storage state of the switchable magnetic device 1. This detection can be carried out by a reader RD, as described in detail further below.

The remanent magnetic moment of the first ferromagnetic materials or layers 3 or the first rare earth nitride alloy has a value relative to that of the remanent magnetic moment of the second ferromagnetic material or layer 5 or the second rare earth nitride alloy that spatially restricts or confines a peripheral magnetic field generated when the first and second rare earth nitride alloys are in anti-aligned or non-aligned magnetic states (the magnetic state or orientation of the first rare earth nitride alloy is non-aligned or anti-aligned with respect to the magnetic state or orientation of the first rare earth nitride alloy).

Figures 4A, 4B, 4C:
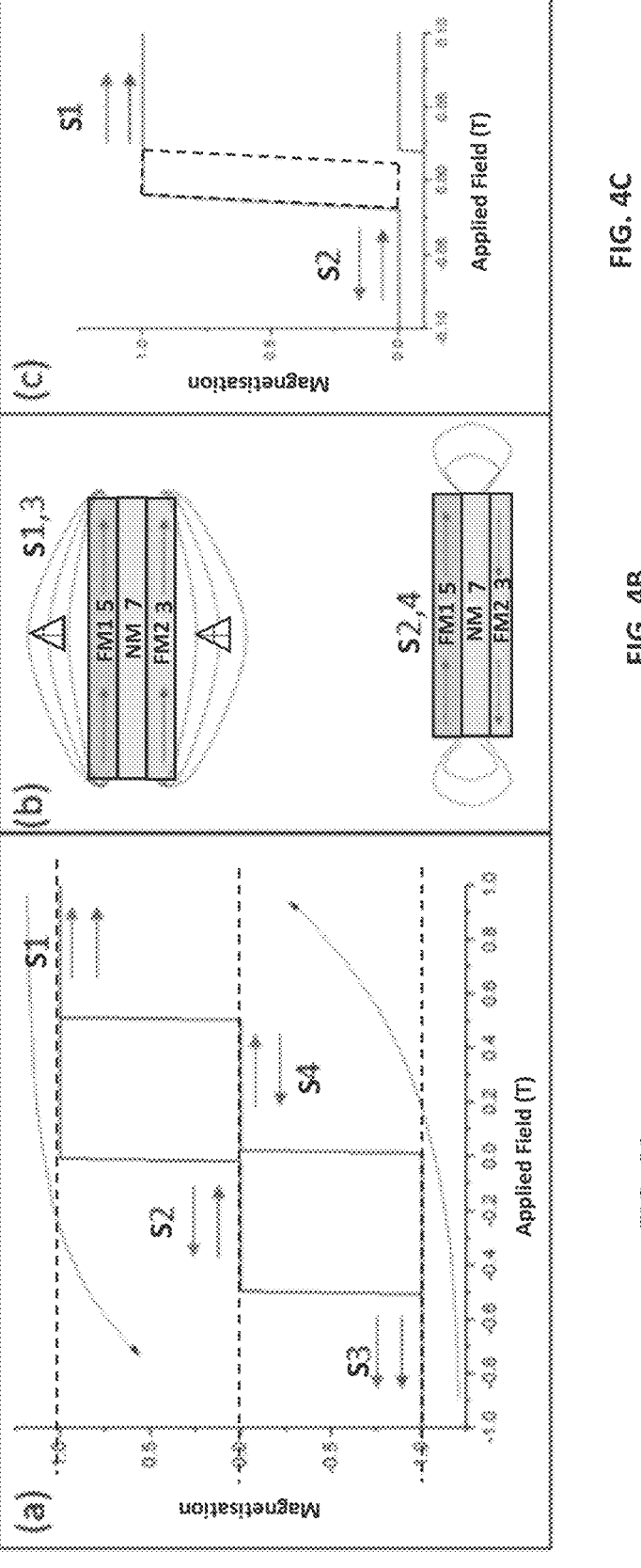
FIGS. 4A to 4C schematically show an exemplary operation method of the switchable magnetic device of the present disclosure.

For example, the remanent magnetic moment of the first ferromagnetic material or layer 3 or the first rare earth nitride alloy may be the same (or may be substantially the same, for example, with a ratio of the remanent magnetic moment of the first rare earth nitride alloy to that of the second alloy being in the range 0.9 to 1.1) as the remanent magnetic moment of the second ferromagnetic material or layer 5 or the second rare earth nitride alloy. As mentioned above, this is achieved by the fractional composition of the lanthanide elements and the volume of the rare earth nitride alloy of each of the first and second ferromagnetic materials or layers 3,5. FIG. 4A to 4B schematically shows contrasting magnetic field strengths and contrasting generated peripheral magnetic fields for the case where the remanent magnetic moment of the first ferromagnetic material or layer 3 or the first rare earth nitride alloy is the same as the remanent magnetic moment of the second ferromagnetic material or layer 5 or the second rare earth nitride alloy. FIGS. 4A and 4B shows four states S1, S2, S3, S4 of the device 1. S1 is a device state when the magnetic states or orientations of the first and second ferromagnetic materials or layers 3,5 are aligned and S2 is a device state when the magnetic states or orientations of the first and second ferromagnetic materials or layers 3,5 are non-aligned (or anti-aligned). States S3 and S4 are states equivalent to those of S1 and S2 respectively. In device state S2, the equal remanent magnetic moments $M_1$ and $M_2$ respectively of the first and second ferromagnetic materials or layers 3, 5 or the first and second rare earth nitride alloys result in a net zero remanent magnetic moment. This provides significantly contrasting magnetic field strengths and contrasting generated peripheral magnetic fields as schematically shown in FIG. 4B.

FIG. 4A shows that a large external magnetic field is applied (parallel to the layers thereof) to the device 1 aligning both ferromagnetic layers 3, 5 in the device 1 to place the device in a state S1. State S1 has a significant fringe field as seen in FIG. 4B. The externally applied magnetic field is reduced towards zero, to pass through zero and at a finite negative applied magnetic field, the orientation of the magnetization of the soft (of lower coercive field) ferromagnetic layer of the device flips or becomes non-aligned with the orientation of the magnetization of the hard (of higher coercive field) ferromagnetic layer. The device 1 in this state S2 has significantly reduced or near zero fringe field as shown in FIG. 4B. As mentioned, States S3 (S4) are equivalent to states S1 (S2) and arrived at by applying the external magnetic field in an opposition direction (negative magnetic field). FIG. 4C shows a useful device operation cycle (see dashed rectangle), during which the device 1 can be changed from state S1 to S2 and back to state S1 with the application of only a relatively small externally applied magnetic field. The simultaneous control and setting of a contrasting coercive field and the remanent magnetic moments for each of the ferromagnetic materials or layers allows such device operation within a relatively small externally applied magnetic field.

Contrasting magnetic field strengths and contrasting generated peripheral magnetic fields are also provided by the switching magnetic device 1 of the present disclosure for the case where the remanent magnetic moment of the first rare earth nitride alloy and first ferromagnetic material or layer 3 is a within a factor of two of the remanent magnetic moment of the second rare earth nitride alloy and the second ferromagnetic material or layer 5. That is, the remanent magnetic moment of the first ferromagnetic material or layer 3 or the first rare earth nitride alloy is no more than twice and no less than half the remanent magnetic moment of the second ferromagnetic material or layer 5 or the second rare earth nitride alloy.

Considering the remanent magnetic moments of the first and second ferromagnetic materials or layers to be $M_1$ and $M_2$ respectively. In device state S1, remanent magnetic moments combine to $M_1+M_2$ in their aligned configuration, and in device state S2, the remanent magnetic moments subtract to $M_1-M_2$ in their anti-aligned configuration. In the case of the remanent magnetic moment $M_1$ of the first ferromagnetic material or layer being, for example, twice (a factor of two times) that of the remanent magnetic moment $M_2$ of the second ferromagnetic material or layer, then $M_1=FtM_2$ (where factor value Ft=2). Consequently, $M_2=M_1/2$ and the resulting net magnetic moment is $M_1/2$ for the device state S2 and $3M_1/2$ for the device state S1. As a result, a contrasting difference of three is present between device sates S1 and S2 providing a contrasting magnetic field strength between these states S1 and S2 and contrasting generated peripheral magnetic fields that permits to distinguish and detect the state of switching magnetic device. Such contrasting states can define storage states of the magnetic device 1.

The remanent magnetic moment $M_1$ (or the amplitude thereof) of the first rare earth nitride alloy and first ferromagnetic material or layer 3 is within a factor of two of the remanent magnetic moment $M_2$ (or the amplitude thereof) of the second rare earth nitride alloy and the second ferromagnetic material or layer 5, that is, $M_1=FtM_2$ where $2\geq Ft\geq 0.5$.

This permits to spatially restrict or confine the peripheral magnetic field generated by the device 1 when the first and second ferromagnetic materials or layers 3, 5 or the first and second rare earth nitride alloys are in the anti-aligned magnetic state S2, S4 compared to the peripheral magnetic field generated when first and second ferromagnetic materials or layers 3, 5 or the first and second rare earth nitride alloys are in the aligned magnetic state S1, S3 as schematically shown in FIG. 4B.

A contrast ratio of (i) a magnetic field strength generated when the first and second ferromagnetic materials or layers 3, 5 or the first and second rare earth nitride alloys have magnetically aligned states to (ii) a magnetic field strength generated when the first and second ferromagnetic materials or layers 3, 5 or the first and second rare earth nitride alloys have magnetically non-aligned states is, for example, at least 2:1. The magnetic field strength is, for example, measured above or below the switchable magnetic device 1 at a measurement or reading position (represented by the triangle on FIG. 4B) located, for example, (perpendicularly) above or below the planes of the deposited capping material layer 11, ferromagnetic materials or layers 3,5 and blocking layer 7 of the device 1, and/or the plane of the substrate 9. The measurement or reading position may be located peripherally around switchable magnetic device 1, for example, above or below the planes of the above-mentioned deposited materials or layers of the device 1 and/or substrate 9, and also laterally to the deposited materials or layers and/or substrate 9 of the device 1. The measurement or reading position is located, for example, at a distance between 0.5 μm and 20 μm from the surface of the device 1.

Figure 5A:
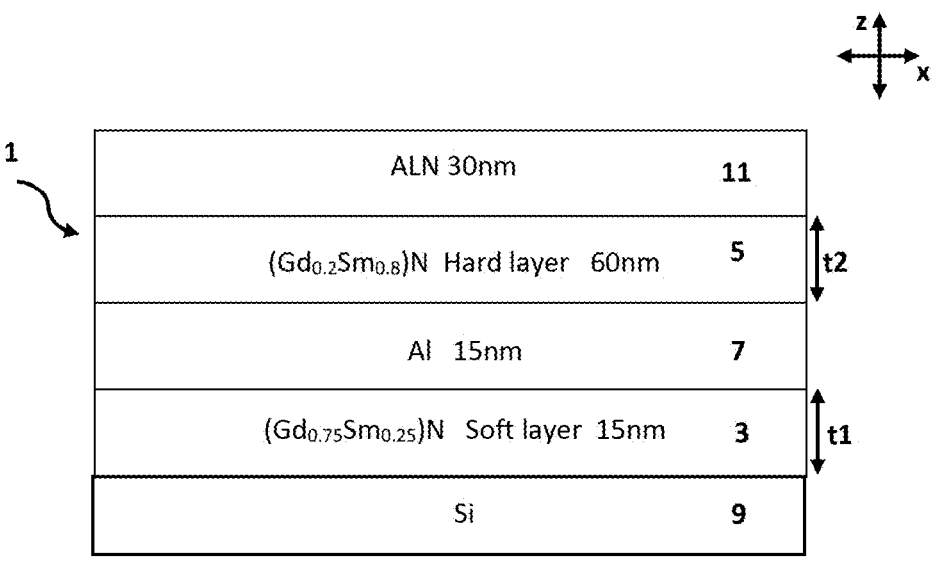
FIGS. 5A and 5B are schematics of exemplary embodiments of switchable magnetic devices of the present disclosure.
Figure 5B:

FIGS. 5A and 5B are schematics of exemplary embodiments of switchable magnetic devices 1 of the present disclosure. The switchable magnetic device 1 of FIG. 5A includes a first ferromagnetic layer 3 of 15 nm in thickness forming a 'soft' magnetic layer comprising a $(Gd_{0.75}Sm_{0.25})N$ solid solution alloy, an exchange blocking layer 7 comprising aluminum of thickness 15 nm, a second ferromagnetic layer 5 of 60 nm in thickness forming a 'hard' magnetic layer comprising a $(Gd_{0.2}Sm_{0.8})N$ solid solution alloy and a 30 nm AlN capping layer 11.

The switchable magnetic device 1 of FIG. 5B is largely identical to that of FIG. 5A but includes a second ferromagnetic layer 5 of 85 nm in thickness forming a 'hard' magnetic layer comprising a $(Gd_{0.1}Sm_{0.9})N$ solid solution alloy. The device 1 of FIG. 5B has a second ferromagnetic layer 5 having a higher coercive field compared to that of the device 1 of FIG. 5A given that the Gd fractional content of the layer is lower (see FIG. 2A). This second ferromagnetic layer 5 also has a larger thickness in view of the lower Gd fractional content so as to increase the number of Gd atoms and the remanent magnetic moment of the layer 5 so that the first ferromagnetic layer 3 is within a factor of two of the remanent magnetic moment of the second ferromagnetic layer 5.

Figure 5C:
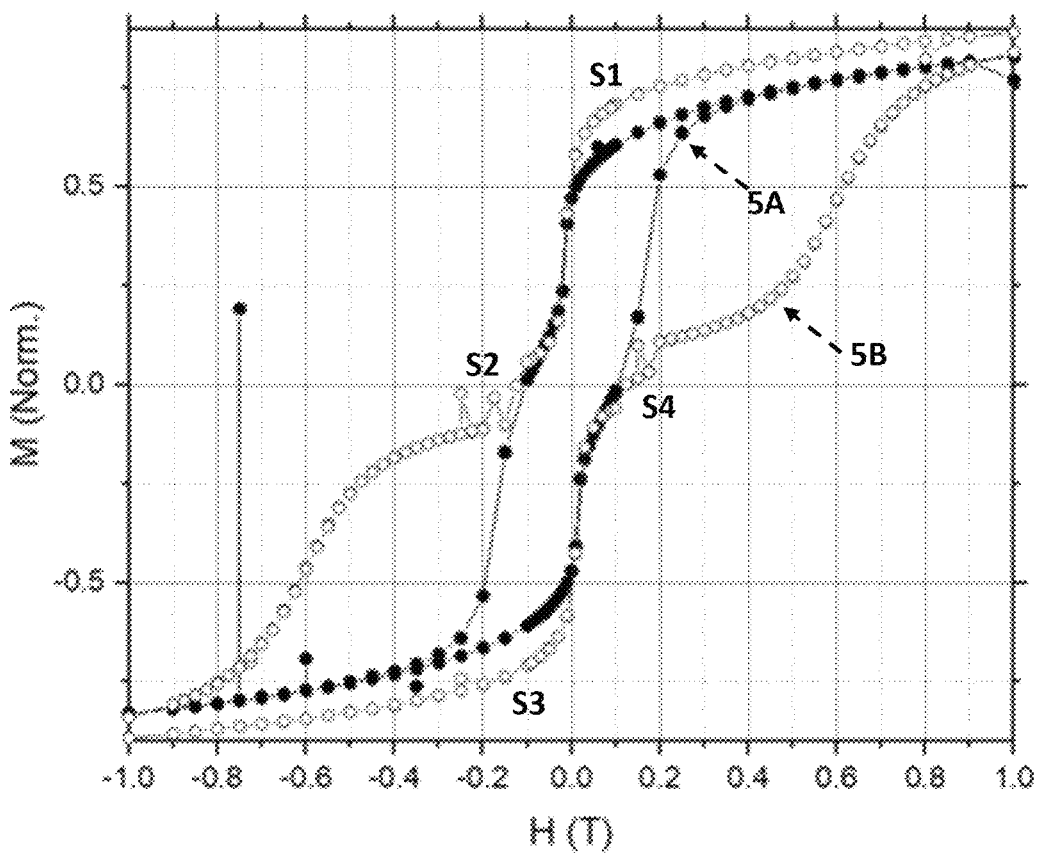
FIG. 5C shows magnetic measurements, taken from the exemplary switchable magnetic devices of FIGS. 5A and 5B, showing independent control of coercive field, and remnant magnetization, the measurements show the magnetization as a function of applied magnetic field for the switchable magnetic devices, the measurements show the four states of the switchable magnetic device schematically presented in FIGS. 4A to 4C.

FIG. 5C shows magnetic measurements taken from these exemplary switchable magnetic devices of FIGS. 5A and 5B. Measurements taken from the device of FIG. 5A are shown with open circles and those taken from the device of FIG. 5B are shown with solid circles. The measurements show the independent control of the magnetic alignment of the ferromagnetic layers and a switching of the 'soft' ferromagnetic layer resulting in a non-magnetic alignment of the ferromagnetic layers due to the different coercive fields of the alloys. The measurements also show that the remnant magnetization of the alloys of the ferromagnetic layers are within a factor of two of each other. The ratio of the remanent magnetic moment of the ferromagnetic layers is very close to 1, as indicated by the magnetic moment remanence in the antiparallel alignment being close to zero when compared to either the state of parallel alignment or to the saturation magnetic moment at high applied magnetic field. The ratio of the remanent magnetic moment of the ferromagnetic layers is estimated to likely be within the ratio range of 0.9 to 1.1 based on the measurements of FIG. 5C.

The devices 1 of FIGS. 5A and 5B concern a device in which each of the first and second rare earth nitride alloys is a solid solution formed using the same lanthanide nitrides of SmN and GdN, with the percentage or fractional composition of a first lanthanide and a second lanthanide in the first rare earth nitride alloy being different to that of the second lanthanide nitride. Alternatively, the second rare earth nitride alloy may be a solid solution formed using different lanthanide nitrides to those used to form the solid solution of the second rare earth nitride alloy. For example, the first rare earth nitride alloy may be a (Gd,Sm)N solid solution alloy and the second rare earth nitride alloy may be a (Gd,Dy)N solid solution alloy or a (Gd,Nd)N solid solution alloy. The first and second rare earth nitride alloys may, of course, each be a (Gd,Dy)N solid solution alloy or a (Gd,Nd)N solid solution alloy.

Figure 6:
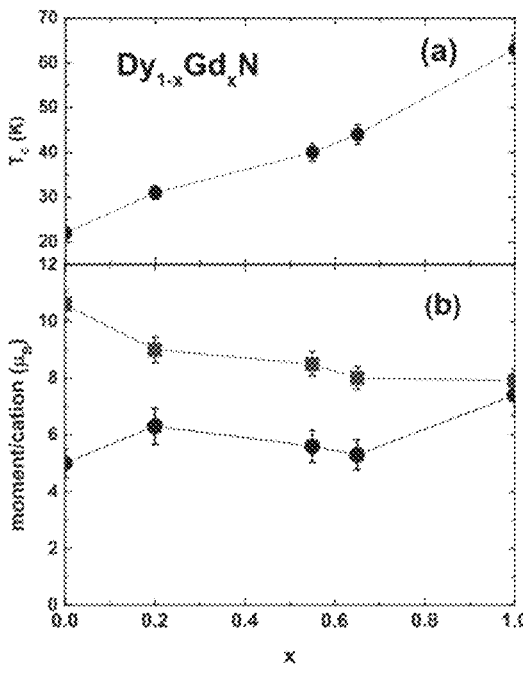
FIG. 6 shows measurements of the Curie temperature (top) and saturation moment (bottom) of (Gd,Dy)N solid solutions. This measured data demonstrates that (Gd,Dy)N solid solutions also permits the magnetic properties to be continuously varied allowing to produce switchable magnetic devices of the present disclosure using such a rare earth alloy or solid solution.

FIG. 6 shows measurements of the saturation moment (bottom) of (Gd,Dy)N solid solutions demonstrating that (Gd,Dy)N alloys similarly can set or determine specific magnetic properties of the device 1 to allow to produce the switchable magnetic devices of the present disclosure using such a rare earth alloy or solid solution. Reference [7] provides measurements relating to GdN/NdN superlattices which make it clear that $Gd_xNd_{1-x}N$ alloys can be exploited and used in the switching magnetic device 1 of the present disclosures to define the magnetic properties of the ferromagnetic layers and to produce magnetic dots.

In some embodiments of the device 1 of the present disclosure, the above mentioned alloys or any other rare earth nitride solid solution alloy may include the lanthanide element La or Lu in the alloy (for example, the alloy (La,Gd,Sm)N or (Lu,Gd,Sm)N). These lanthanide elements allow modification of the coercive field without (significantly) altering the net magnetization of the layer.

The layers of device 1 are grown as thin films whose thicknesses ranges from 10 nm to several hundreds of nm. All layers of the device 1 are grown in ultra-high vacuum on the substrate 9 selected for the target application or device. As previously mentioned, the films can alternatively be deposited on top of a device structures, for example, a Josephson junction.

Device growth is carried out in a growth chamber by thermal evaporation of the rare-earth metal in the presence of typically $10^{-6}$ mbar to $10^{-3}$ mbar of pure $N_2$ gas as the nitrogen source. Alternatively, both ammonia and activated nitrogen can be also used as a suitable nitrogen or anion sources. The growth was by molecular beam epitaxy for the devices of FIGS. 5A and 5B.

Typical growth rates are of 0.1 nm per second. The substrate 9 may be at ambient temperature or can alternatively be actively heated to several hundred degrees (for example, to a temperature that is above ambient temperature and up to 1000° C. The electrical conductivity of the rare-earth nitride layer can be engineered by creating nitrogen vacancies in the layer, achieved by increasing the evaporation rate of the rare-earth metal or by decreasing the pressure of nitrogen in the chamber.

The exchange blocking layer 7 may, for example, be a rare-earth nitride, in which case it is grown as above. It may alternatively be a non-magnetic metal or any nonmagnetic insulator; typical examples are Al, AlN, GaN, Ag whose growth and deposition is well known. A capping layer 11 is grown on the multi-layer stack to protect the final rare-earth nitride layer 5 from exposure to atmosphere.

The grown multi-layered structure can then be processed and the layers thereof patterned into a plurality of dot structures using conventional photo-lithography methods. The lithography can be carried out either (i) before film growth which is then followed by chemical lift-off or alternatively (ii) after film growth followed by an etching process. Both of these processes are carried out using well established and known methods.

Figure 3:
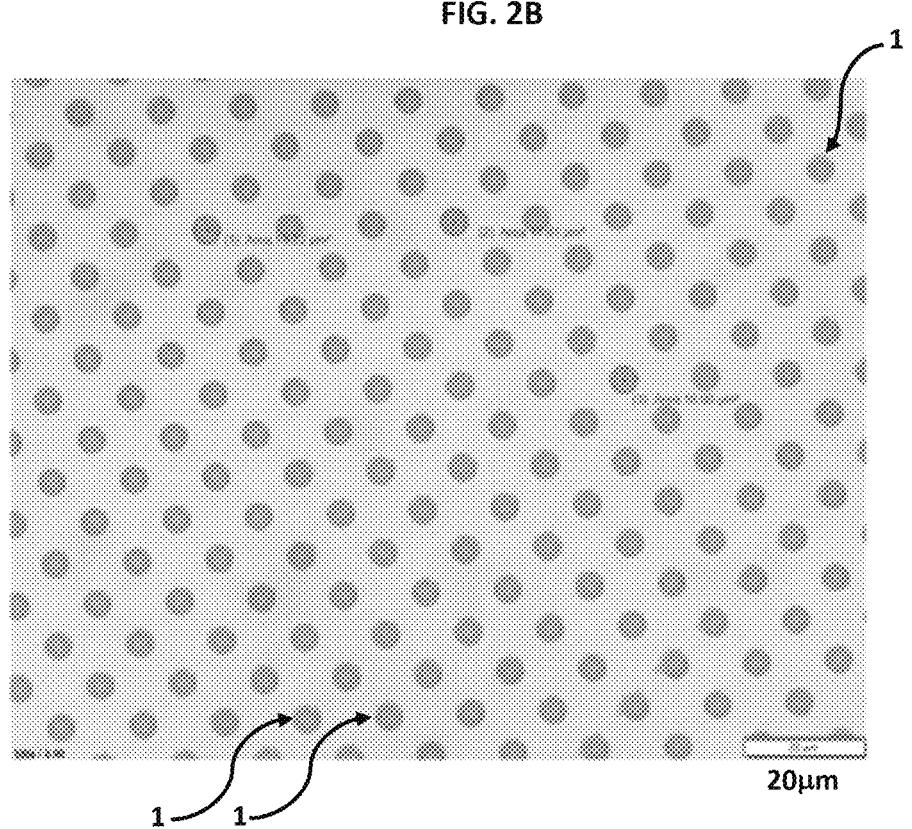
FIG. 3 shows an array of switchable magnetic devices of the present disclosure of approximately 5 μm diameter. The switchable magnetic device is a magnetic dot or island.

FIG. 3 shows an image an array of devices 1 forming dots or islands which are, for example, approximately 5 μm in diameter separated, for example, by a periodic distance of about 15 μm. The dots or islands define a support or pillar structure extending away from a base, the top surface of the support or pillar structure being visible in the image of FIG. 3. The dot may have a (substantially) circular cross-section as seen in FIG. 3, but may also have other cross-sectional profiles that are non-circular, for example, may have an elliptical cross-section. Each dot forms for example an addressable or switchable storage element. The switchable magnetic device 1 is a switchable magnetic dot or island, and the array forms a memory device comprising a plurality of switchable magnetic dots or islands. Switchable magnetic dots with a diameter of a few-microns can thus assure a high data-storage density. The switchable magnetic dots can have their magnetic moments changed to determine contrasting fringe magnetic fields sufficiently contrasting to be sensed by an adjacent reader RD, for example, a Josephson junction.

The present disclosure also concerns a digital data storage device including a plurality of switchable magnetic devices 1 or switchable magnetic dots or islands, such as shown, for example, in FIG. 3. The switchable magnetic device 1 is, for example, a cryogenic switchable magnetic device and the switchable magnetic dot is, for example, a cryogenic switchable magnetic dot.

The switchable magnetic device 1 operates at low temperatures, for example cryogenic temperatures, for example, at temperatures≤120K or ≤−153° C. The digital data storage device is, for example, a cryogenic digital data storage device.

The present disclosure also concerns a digital data storage system or cryogenic digital data storage system (schematically shown in FIGS. 7A to 7E) including at least one or a plurality of storage elements wherein each storage element comprises or consists of the switchable magnetic device 1 or switchable magnetic dot. The system further includes at least one writer WR configured to set a storage state of the storage element, and/or at least one reader RD configured to detect or measure a magnetic fringe field or magnetic field strength of the storage element or of each storage element. The reader RD may comprise or consist of a device configured to measure the strength of a magnetic field, for example, a magnetometer such as a scaler magnetometer. The reader RD may comprise or consist of a superconducting circuit or a Josephson junction device. The writer WR may comprise or consist of a magnetic field generator that generates a magnetic field that is applied, for example, parallel to the layers of the device 1 (FIG. 7C) to set the magnetic alignment of the ferromagnetic layers 3, 5. The writer WR may alternatively comprise or consist of spin transfer torque device configured to produce a spin-polarized current that assures switching of the 'soft' ferromagnetic layer due to the spin transfer torque produced. The writer WR may alternatively comprise or consist of a magnetic circular dichroism device. FIG. 7E schematically shows a (cryogenic) digital data storage system including one or more storage elements each comprising the switchable magnetic device 1 or dot, and further including at least one writer WR to set a storage state of the storage element, and at least one reader RD configured to detect or measure a magnetic fringe field of the storage element.

A first storage state of the storage element or switchable magnetic device 1 is set by setting a magnetic alignment of the first and second ferromagnetic materials or layers 3, 5 to the same aligned magnetic state to set a first storage state. This can be done, for example, by increasing the externally applied magnetic field (for example, from 0T) to a high magnetic field strength or intensity. A second storage state can be set by setting a magnetic alignment of the first and second ferromagnetic materials or layers 3, 5 to the same aligned magnetic state as indicated previously and then reducing and reversing the applied magnetic field intensity to a second magnetic field intensity to set a magnetic alignment of the first and second ferromagnetic materials or layers to in an anti-aligned magnetic state. This is schematically shown in FIG. 4A. Digital data storage states representing "1" or "0" for the magnet on or off (or vice-versa) can thus be set and stored.

Alternatively, the first and second storage states may be set by a spin transfer torque device configured to produce a spin-polarized current that assures switching of the 'soft' ferromagnetic layer due to the spin transfer torque produced or by a magnetic circular dichroism device.

The switchable magnet device 1 of the present disclosure includes ferromagnetic layers containing alloys (solid solutions) of lanthanide mononitrides whose magnetic properties can be tuned and set to simultaneously satisfy the specific demands of a facility to switch one ferromagnetic layer easily while the second ferromagnetic layer remains unchanged, the provision of contrasting magnetic field strengths and contrasting generated peripheral magnetic fields between the two states that can be read reliably as one state or the other by a sensing device, and the facility to form structures on a micron scale.

While the invention has been disclosed with reference to certain preferred embodiments, numerous modifications, alterations, and changes to the described embodiments, and equivalents thereof, are possible without departing from the sphere and scope of the invention. Accordingly, it is intended that the invention not be limited to the described embodiments, and be given the broadest reasonable interpretation in accordance with the language of the appended claims.

REFERENCES

[1] C. Pot, et al. "Contrasting para- and ferro-magnetic responses of (Gd,Dy)N alloys" Appl. Phys. Lett. 119, 172406 (2021).

[2] E.-M. Anton et al, "Spin/orbit moment imbalance in the near-zero moment ferromagnetic semiconductor SmN", Phys. Rev. B 87, 134414 (2013).

[3] J. F. McNulty et al., "Twisted phase of the orbital-dominant ferromagnet SmN in a GdN/SmN heterostructure", Phys Rev. B 91, 174426 (2015).

[4] J. F. McNulty et al. "On the ferromagnetic ground state of SmN" Phys. Rev. B93, 054413 (2016).

[5] F. Natali et al., "Epitaxial GdN/SmN-based superlattices grown by molecular beam epitaxy", MRS Advances, DOI:10.1557/adv.2017.147 (2017).

[6] E.-M. Anton et al., "GdN/SmN superlattices; Influence of a Zeeman/exchange conflict", AIP Advances 11, 015348 (2021).

[7] J. F. NcNulty et al., "Tunable magnetic exchange springs in semiconductor GdN/NdN superlattices", Phys. Rev. B 100, 094441 (2019).

The entire content of each one of the above references being incorporated herein by reference.

The invention claimed is:

1. A switchable magnetic device comprising:
   a first ferromagnetic material or layer comprising or consisting of a first rare earth nitride alloy, the first rare earth nitride alloy including at least two lanthanide species;
   a second ferromagnetic material or layer comprising or consisting of a second rare earth nitride alloy, the second rare earth nitride alloy including at least two lanthanide species;
   a blocking material or layer located between the first and second ferromagnetic materials or layers;
   wherein the first and second ferromagnetic materials or layers have different coercive fields to permit independent control of a magnetic alignment of the first and second ferromagnetic materials or layers;
   wherein a remanent magnetic moment of the first ferromagnetic material or layer and a remanent magnetic moment of the second ferromagnetic material or layer spatially restrict or confine a peripheral magnetic field generated when the first and second ferromagnetic materials or layers are in an anti-aligned magnetic state to permit contrasting peripheral magnetic fields to be generated when the first and second ferromagnetic materials or layers are in anti-aligned and aligned magnetic states; and
   wherein the first rare earth nitride alloy has a lower coercive field than that of the second rare earth nitride alloy permitting the first rare earth nitride alloy to change magnetic alignment and place the first and second ferromagnetic materials or layers in opposing magnetic alignment states.

2. The switchable magnetic device according to claim 1, wherein a remanent magnetic moment of the first rare earth nitride alloy is within a factor of two of a remanent magnetic moment of the second rare earth nitride alloy.

3. The switchable magnetic device according to claim 2, wherein $M_1$ is the remanent magnetic moment of the first rare earth nitride alloy, $M_2$ is the remanent magnetic moment of the second rare earth nitride alloy, Ft is a factor value; and $M_1 = FtM_2$ where $2 \geq Ft \geq 0.5$.

4. The switchable magnetic device according to claim 1, wherein the contrasting peripheral magnetic fields are generated at a measurement or reading position located peripherally to an external surface of the device.

5. The switchable magnetic device according to claim 1, wherein the remanent magnetic moment of the first rare earth nitride alloy is determined by a fractional composition of the at least two lanthanide species and a volume of the first ferromagnetic material or layer, and the remanent magnetic moment of the second rare earth nitride alloy is determined by a fractional composition of the at least two lanthanide species and a volume of the second ferromagnetic material or layer.

6. The switchable magnetic device according to claim 1, wherein the first rare earth nitride alloy is a solid solution of at least a first lanthanide nitride and at least a second lanthanide nitride, and the second rare earth nitride alloy is a solid solution of at least a third lanthanide nitride and at least a fourth lanthanide nitride.

7. The switchable magnetic device according to claim 1, wherein the first rare earth nitride alloy is a solid solution of at least a first lanthanide nitride and at least a second lanthanide nitride, and the second rare earth nitride alloy is a solid solution of at least the first lanthanide nitride and at least the second lanthanide nitride, the percentage composition of a first lanthanide and a second lanthanide in the first rare earth nitride alloy being different to that of the second lanthanide nitride.

8. The switchable magnetic device according to claim 1, wherein a remanent magnetic moment of the first and second rare earth nitride alloys in magnetically aligned states generates a peripheral magnetic field extending a distance outside the switchable magnetic device permitting detection of a first storage state of the switchable magnetic device; and a remanent magnetic moment of the first and second rare earth nitride alloys in magnetically non-aligned states generates the spatially restricted or confined peripheral magnetic field permitting detection of a second storage state of the switchable magnetic device.

9. The switchable magnetic device according to claim 8, wherein a contrast ratio of (i) a magnetic field strength generated when the first and second rare earth nitride alloys have magnetically aligned states to (ii) a magnetic field strength generated when the first and second rare earth nitride alloys have magnetically non-aligned states is at least 2:1, the magnetic field strength being measured peripherally to an external surface of the switchable magnetic device.

10. The switchable magnetic device according to claim 1, wherein the first rare earth nitride alloy, the blocking material or layer and the second rare earth nitride alloy define a superposed multi-layer structure.

11. The switchable magnetic device according to claim 1, wherein the change of the magnetic alignment of the first rare earth nitride alloy is permitted without a change in magnetic alignment of the second rare earth nitride alloy.

12. The switchable magnetic device according to claim 1, wherein the second rare earth nitride alloy has a coercive field at least 2 times greater than that of the first rare earth nitride alloy.

13. The switchable magnetic device according to claim 1, wherein the switchable magnetic device is a switchable magnetic dot or island.

14. The switchable magnetic device according to claim 1, wherein the first and/or second rare earth nitride alloys comprises or consists solely of (Gd,Sm)N, or (Gd,Dy)N, or (Gd,Nd)N.

15. The switchable magnetic device according to claim 14, wherein the first and/or second rare earth nitride alloys further include lanthanum and/or lutetium.

16. The switchable magnetic device according to claim 1, wherein the blocking material or layer comprises or consists solely of a non-magnetic material.

17. A cryogenic digital data storage device including at least one or a plurality of switchable magnetic devices according to claim 1.

18. A cryogenic digital data storage system including at least one or a plurality of storage elements wherein each storage element comprises the switchable magnetic device according to claim 1; and further including at least one writer to set a storage state of the storage element, and at least one reader configured to detect or measure a magnetic fringe field of the storage element.

19. Method for setting a storage state of a switchable magnetic device, the method comprising the steps of:
   providing at least one switchable magnetic device according to claim 1; and
   setting a magnetic alignment of the first and second ferromagnetic materials or layers to the same aligned magnetic state to set a first storage state; or setting a magnetic alignment of the first and second ferromagnetic materials or layers to an anti-aligned magnetic state to set a second storage state.

20. A switchable magnetic device comprising:
   a first ferromagnetic material or layer comprising or consisting of a first rare earth nitride alloy, the first rare earth nitride alloy including at least two lanthanide species;
   a second ferromagnetic material or layer comprising or consisting of a second rare earth nitride alloy, the second rare earth nitride alloy including at least two lanthanide species;
   a blocking material or layer located between the first and second ferromagnetic materials or layers;
   wherein the first and second ferromagnetic materials or layers have different coercive fields to permit independent control of a magnetic alignment of the first and second ferromagnetic materials or layers;
   wherein a remanent magnetic moment of the first ferromagnetic material or layer and a remanent magnetic moment of the second ferromagnetic material or layer spatially restrict or confine a peripheral magnetic field generated when the first and second ferromagnetic materials or layers are in an anti-aligned magnetic state to permit contrasting peripheral magnetic fields to be generated when the first and second ferromagnetic materials or layers are in anti-aligned and aligned magnetic states; and
   wherein the remanent magnetic moment of the first rare earth nitride alloy is determined by a fractional composition of the at least two lanthanide species and a volume of the first ferromagnetic material or layer, and the remanent magnetic moment of the second rare earth nitride alloy is determined by a fractional composition of the at least two lanthanide species and a volume of the second ferromagnetic material or layer.

* * * * *